United States Patent [19]

Redfern et al.

[11] Patent Number: 5,563,617
[45] Date of Patent: Oct. 8, 1996

[54] DOPPLER MICROWAVE SENSOR

[75] Inventors: Stephen W. Redfern; Paul A. Tyson; Peter P. Blunden, all of Lincoln, United Kingdom

[73] Assignee: Plessey Semiconductors Limited, United Kingdom

[21] Appl. No.: 283,022

[22] Filed: Jul. 29, 1994

[30] Foreign Application Priority Data

Jul. 31, 1993 [GB] United Kingdom ............... 9315892

[51] Int. Cl.$^6$ .................................................. H01Q 13/10
[52] U.S. Cl. .................. 343/767; 343/702; 343/711; 343/909; 455/293
[58] Field of Search .................................. 343/702, 711, 343/713, 767, 909, 910, 911 R; 455/129, 280, 281, 291, 293; H01Q 13/10

[56] References Cited

U.S. PATENT DOCUMENTS

| | | | |
|---|---|---|---|
| 2,959,783 | 11/1960 | Iams | 343/909 X |
| 3,094,663 | 6/1963 | Siegel | 343/767 X |
| 3,665,480 | 1/1969 | Fassett | 343/700 MS |
| 4,249,262 | 2/1981 | Fenk | 333/117 D X |
| 4,287,520 | 9/1981 | Van Vliet et al. | 343/909 |
| 4,334,229 | 6/1982 | Boblett | 343/767 |
| 4,405,925 | 9/1983 | Lindner et al. | 343/785 X |
| 4,410,890 | 10/1983 | Davis et al. | 343/767 X |
| 4,551,692 | 11/1985 | Smith | 343/909 X |
| 4,596,047 | 6/1986 | Watanabe | 343/840 |
| 4,688,005 | 8/1987 | Kipnis | 331/117 R |
| 4,845,506 | 7/1989 | Shibata et al. | 343/713 |
| 5,144,439 | 9/1992 | Wignot | 455/180.1 X |
| 5,177,494 | 1/1993 | Dorrie et al. | 343/711 |
| 5,264,860 | 11/1993 | Quan | 343/767 |
| 5,337,065 | 9/1994 | Bonnet et al. | 343/700 MS X |
| 5,376,943 | 12/1994 | Blunden et al. | 343/767 X |

FOREIGN PATENT DOCUMENTS

| | | |
|---|---|---|
| 0057480 | 8/1982 | European Pat. Off. . |
| 1211851 | 11/1970 | United Kingdom . |
| 1534210 | 11/1978 | United Kingdom . |
| 2217112 | 10/1989 | United Kingdom . |

Primary Examiner—Donald T. Hajec
Assistant Examiner—Steven Wigmore
Attorney, Agent, or Firm—Kirschstein et al.

[57] ABSTRACT

A Doppler microwave sensor for a vehicle alarm employs a mixer stage and a signal-processing stage on a printed circuit board, the printed circuit board having a ground plane containing a slot antenna which is coupled to the mixer stage. The ground plane is electrically connected to an electrically conductive enclosure which is disposed behind the slot antenna and encloses the component parts of the mixer and signal-processing stages. A dielectric lens may be placed over the slot antenna to provide a transmission beam pattern which is configured to the vehicle in which the sensor is to be used. In a preferred embodiment, the mixer stage is based around a self-oscillating mixer arrangement in which the active element is a bipolar transistor and a single antenna is employed both to transmit the oscillator signal and to receive the Doppler-shifted return signal.

11 Claims, 4 Drawing Sheets

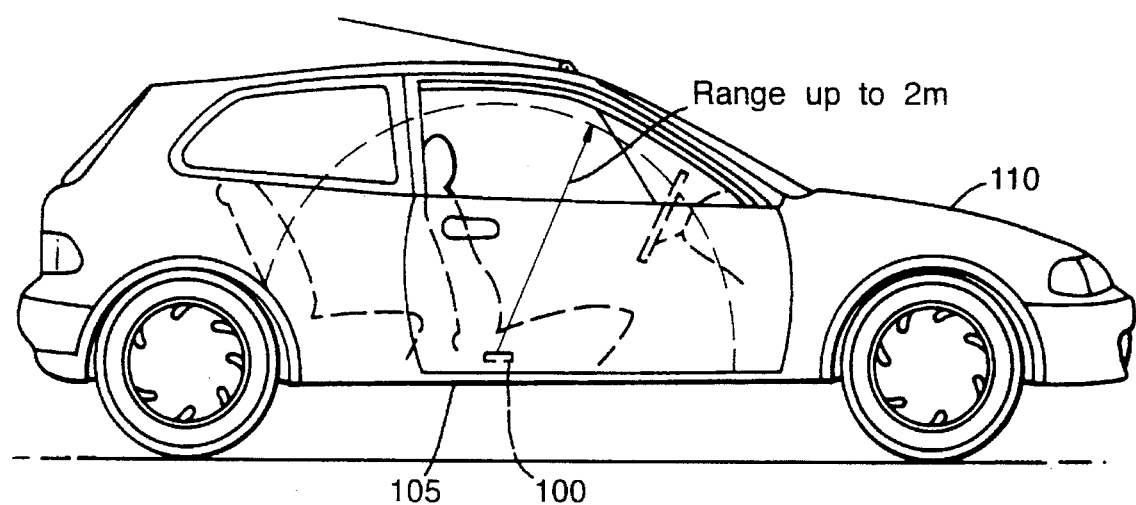

५,५६३,६१७

DOPPLER MICROWAVE SENSOR

TECHNICAL FIELD

The invention relates to a Doppler microwave sensor, and in particular to a Doppler microwave sensor as used in a vehicle intruder alarm.

BACKGROUND ART

A number of techniques are known for warning against the presence of intruders, the most common of which involve the use of ultrasonic and/or passive infrared sensors. While being relatively inexpensive to make and install, these devices are prone to false alarms due to environmental changes such as temperature fluctuations and, in the case of ultrasonics-based alarms, air pressure fluctuations. In addition to increasing the likelihood of false alarms, environmental changes such as temperature variations also lead to undesirable changes in alarm sensitivity.

Microwave sensors are available, but up to now these have been relatively expensive and have produced only marginal improvement over the more common ultrasonic and infra-red types. They have also failed to meet official specifications regarding EMC (electromagnetic compatibility) and frequency stability.

A conventional Doppler sensor arrangement is shown in FIG. 1. In FIG. 1, the output of a microwave oscillator 12 is fed to a transmit antenna 14 through a coupler 13, after being first amplified, if necessary, in an amplifier 15. A return signal, which may differ from the transmitted frequency where movement has occurred within the space illuminated by the transmitted signal, is received on a receive antenna 16 and fed to a mixer 17 where it is mixed with the coupled local oscillator signal 12 at an input 11 to generate a baseband IF signal on a line 18. The IF signal on line 18 is then taken to a signal processing stage 19 which provides an indication, usually audible, that movement has taken place.

The use of two antennas and a separate mixer and oscillator add to the complexity and hence cost of the conventional arrangement. In addition, such known arrangements have, up to now, had poor frequency stability and have been prone to false alarms due to factors such as electromagnetic interference entering the alarm and the alarm being triggered by the movement of targets located outside the vehicle being monitored.

SUMMARY OF THE INVENTION

According to a first aspect of the invention, there is provided a Doppler microwave sensor comprising a mixer stage and a signal processing stage following the mixer stage, the mixer stage and the signal processing stage being mounted on a printed circuit board, the printed circuit board having a ground plane, in which is configured a slot antenna coupled to the mixer stage and to which an electrically conductive enclosure is electrically connected, the enclosure being disposed behind the slot antenna and enclosing the component parts of the mixer stage and signal processing stage.

The inventors have found that by employing a slot antenna in a PCB-mounted Doppler microwave sensor arrangement and screening the electronics of the sensor arrangement in a Faraday cage situated behind the slot antenna, Government EMC specifications may be readily met. In this regard, the only two mechanisms whereby electromagnetic interference may enter the alarm is, on the one hand, through the power supply and, on the other hand, through the slot antenna. However, since in a preferred embodiment of the invention the power supply is arranged to be filtered, and since the slot antenna is a narrow-band system, the sensor of the invention is virtually immune to EM interference. The result is a significant improvement in the false-alarm rate of the sensor.

The beam pattern formed by the slot antenna may be modified to suit the volume of space illuminated by the transmitter oscillator by arranging for a dielectric lens to be disposed above the slot antenna. The advantage of this measure is that the antenna pattern is confined to the internal volume of a vehicle in which the sensor is mounted, thereby further decreasing the likelihood of false alarms.

The dielectric lens may comprise a series of chevrons running one behind the other along an axis substantially perpendicular to the longitudinal axis of the slot antenna and substantially bisecting it. Not all the chevrons will be complete, since some in the series will come to a virtual point outside the area occupied by the lens. The chevrons may be formed by raised portions of the material composing the lens. Although this is the preferred way of realising the lens, other ways may be equally possible.

The signal-processing stage may comprise a signal-amplifying means for amplifying the signal from the output of the mixer stage, a filtering means for filtering out signals other than a wanted low-frequency Doppler signal at an output of the amplifying means, a rectifying means fed from the filtering means and comparator means fed from the rectifying means, the comparator means being arranged to provide a sensor output signal when the signal at its input exceeds a given threshold.

The filtering means may be either a low-pass or a band-pass filter. If the latter is employed, the pass band must be centred on the frequencies of interest and must be of sufficient bandwidth to cover those frequencies.

By coupling the IF output of the mixer arrangement to the above signal processing means, the presence of an intruder may be indicated to the owner of a vehicle in which the sensor is mounted. In order to reduce the likelihood of false alarms, the sensor output may be weighted by arranging for the threshold-detected output signal of the processing means to feed a diode pump, an indication of target movement being then provided only when a certain number of "events" (detections of movement) have been picked up by the sensor.

The mixer stage may be a mixer arrangement as described below.

According to a second aspect of the invention, there is provided a mixer arrangement comprising a self-oscillating mixer stage and an antenna connected to the self-oscillating mixer stage, wherein the antenna serves both as a transmit antenna and as a receive antenna.

Use of a mixer stage which is self-oscillating achieves savings in hardware over a system involving a separate oscillator and mixer. Similar savings are made by configuring the mixer so that a common antenna is used for both transmission and reception, as opposed to employing separate antennas for the two functions.

The mixer stage may include a ceramic resonator for the stabilisation of the oscillator frequency. By using a ceramic resonator in the mixer, the oscillator frequency of the arrangement may be kept to very tight tolerances, something which is essential if such an arrangement is to be used as part of a Doppler microwave sensor. The mixer stage may be set to run at a frequency of 2.45 GHz, which is one of two frequencies currently allocated by the Department of Trade and Industry (DTI) for microwave sensors.

A ceramic resonator is used, since this acts as a parallel tuned circuit of very high Q, far higher than can be realised discretely at microwave frequencies, and can therefore maintain the tight frequency tolerances required. It is also physically small and rugged, being a small, silver-plated cylinder of high dielectric constant ceramic.

The self-oscillating mixer stage may comprise a bipolar transistor as the active element for sustaining oscillations. By using a readily available bipolar transistor as the active element, the cost of manufacturing the mixer arrangement may be kept low. Further, the inventors have discovered that transistors exist which, while having a sufficiently high transition frequency ($f_T$) to allow oscillation to occur at 2.45 GHz, also have the requisite high-gain ($\beta$) at low operating currents, so that a mixer based on such a transistor may be incorporated in a Doppler sensor running off its own battery supply without rapidly depleting that supply.

The mixer stage may comprise a diode means for compensating for variations in the base-emitter voltage of the transistor with temperature. Such variations would, if left uncompensated, affect the frequency stability of the mixer arrangement.

The self-oscillating mixer stage preferably comprises a bipolar transistor, having a base, a collector and an emitter, and first and second potential levels and a reference potential level, the collector of the transistor being coupled to the first potential level by means of a first inductance and to the reference potential level by means of a first capacitance and the ceramic resonator in series, the base of the transistor being coupled by means of a second inductance to the mid-point of a bias potential divider connected between the first and second potential levels, and the emitter of the transistor being coupled to the second potential level by means of a resistance and a second capacitance in parallel, the diode means being connected in series with the lower half of the bias potential divider, the antenna being coupled to the emitter, and the output of the mixer arrangement being taken from the emitter or collector of the transistor.

The reference potential level and the first or second potential level may be substantially the same level, which may be nominally ground potential.

According to a third aspect of the invention, there is provided a vehicle comprising a Doppler microwave sensor as described above.

BRIEF DESCRIPTION OF THE DRAWINGS

The invention will now be described, by way of example only, with reference to the drawings, of which:

FIG. 8 shows a Doppler microwave sensor according to the further aspect of the invention mounted in a vehicle.

DETAILED DESCRIPTION OF THE INVENTION

Figure 1:
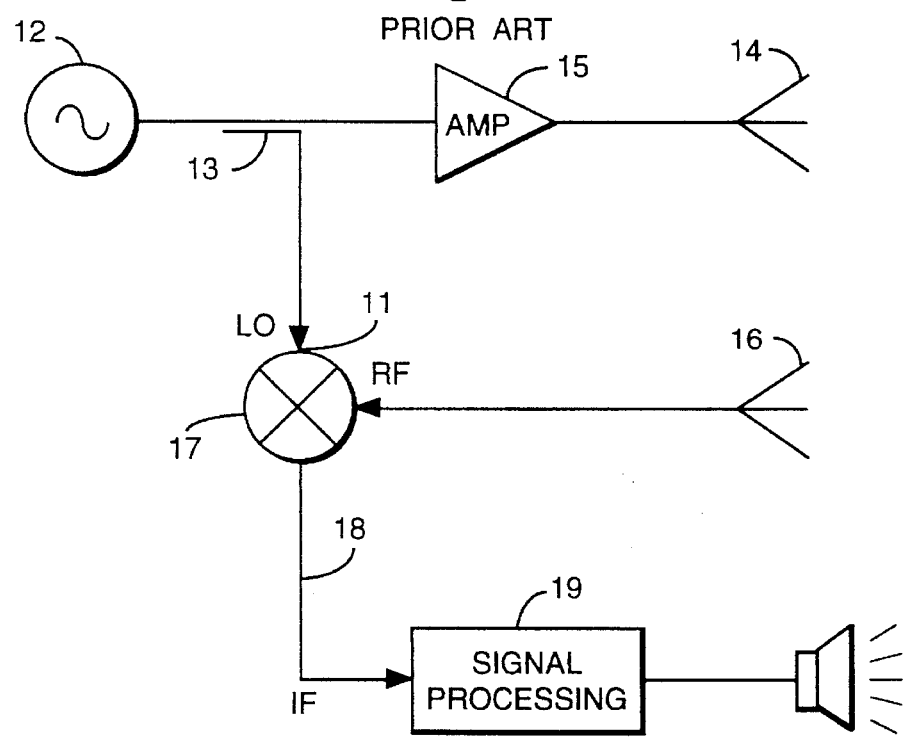
FIG. 1 is a schematic diagram of a conventional Doppler microwave sensor arrangement.
Figure 2:
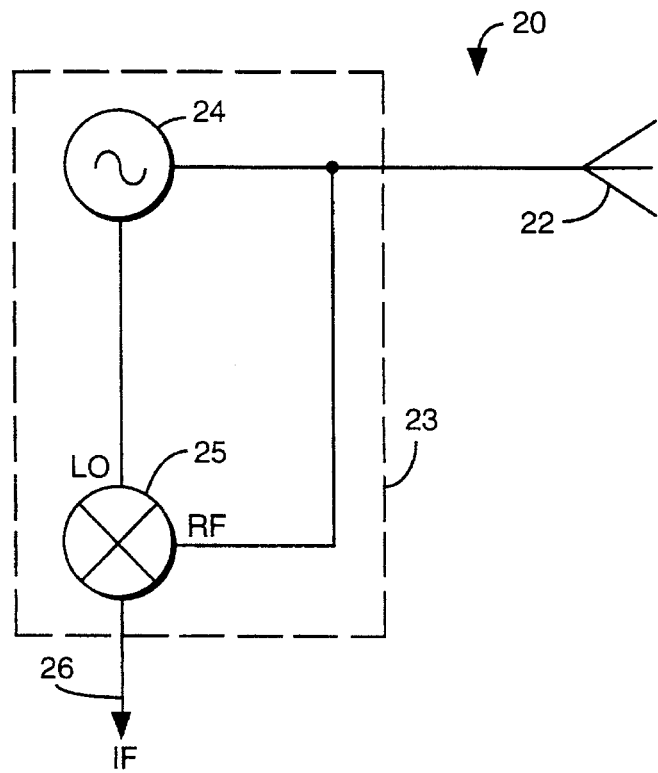
FIG. 2 is a functional diagram of a mixer arrangement according to one aspect of the invention.

The essential outline of a mixer arrangement 20 according to one aspect of the invention is shown in FIG. 2. In FIG. 2, instead of two separate antennas being used, one for transmit and one for receive (see FIG. 1), one antenna 22 is used for both functions. An amplifying element 23 serves both as oscillator and mixer, so that two functions, transmission of the RF carrier and mixing of the return signal, are performed simultaneously in the same circuit element. This is shown in conceptual form as an oscillator 24 feeding the antenna 22 with the carrier, at the same time acting as a local oscillator to be mixed in a mixer 25 with the RF return signal received on the same antenna 22. The IF signal is output from the amplifying element 23 along a line 26.

Figure 3:
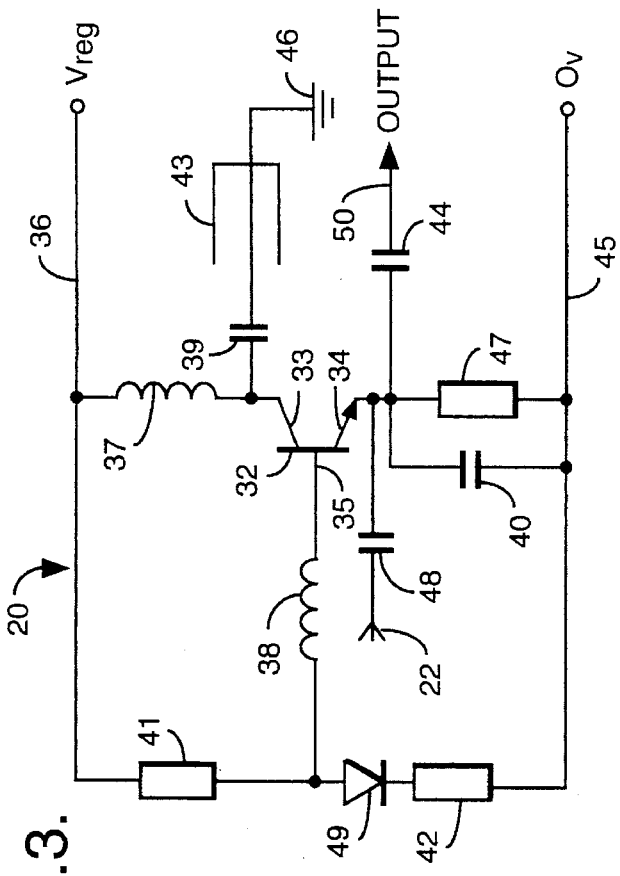
FIG. 3 is a schematic diagram of the mixer arrangement of FIG. 2.

FIG. 3 shows a preferred realisation of this arrangement, in which the amplifying element is constituted by a bipolar transistor 32. The transistor 32 acts as the active element in an oscillator oscillating at a frequency of 2.45 GHz. The collector 33 of the transistor is coupled to a first, regulated, voltage rail 36 by means of an inductance 37 and to a reference potential point 46 (nominally ground) by means of a capacitance 39. The voltage rail 36 is filtered by a suitable filtering means (not shown) in order to provide protection against the influence of stray electromagnetic fields. The emitter 34 of the transistor 32 is coupled to a second voltage rail 45, which may be at the same potential as the ground reference 46, by means of a capacitance 40 and a resistance 47 in parallel. Resistance 47, along with two resistances 41 and 42, forms a bias arrangement for establishing the correct bias, conditions for the transistor 32, the mid-point of the resistor pair 41, 42 being taken to the base 35 of transistor 32 by means of a further inductance 38.

The emitter of the transistor 32 is also taken via a capacitance 48 to an antenna 22, from which the 2.45 GHz oscillator signal is radiated. Return signals are received also on the antenna 22 and are mixed with the carrier, already present on the emitter, this carrier now acting as a local oscillator signal. The mixing action of the arrangement is generated by the non-linear nature of the base-emitter junction of transistor 32, this non-linearity giving rise to signals at the sum and difference of the local oscillator and received signal frequencies.

Where the transmitted carrier signal is returned from a moving target, e.g. an intruder, a Doppler shift will result and the antenna 22 will pick up a return signal at a frequency slightly different from that of the transmitted carrier. This frequency, the Doppler frequency, is related to the velocity of the reflecting target by the expression:

$$f_D = v \cdot f/c$$

where $f_D$ is the Doppler frequency, v is the velocity of the target, f is the radar frequency (2.45 GHz), and c is the speed of light ($3 \cdot 10^8$ m/s).

Figure 4:
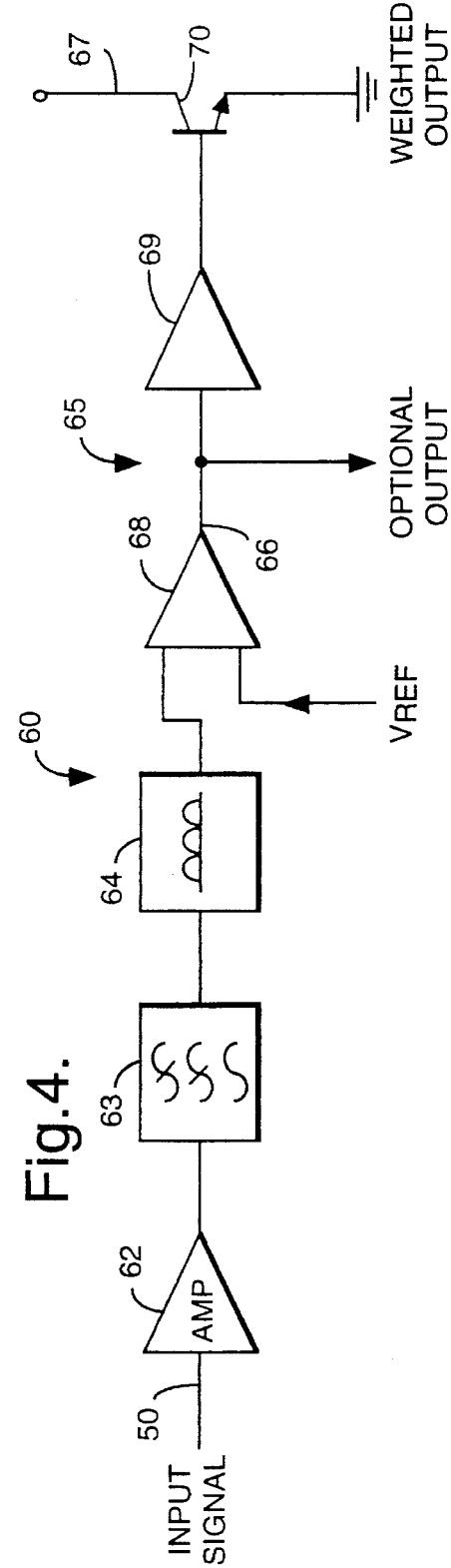
FIG. 4 is a block diagram of a signal processing stage as used in a Doppler microwave sensor according to a further aspect of the invention.

The mixer output is taken along a line 50 via a coupling capacitor 44 to the input of the signal processing stage shown in FIG. 4. Since the difference frequency (the Doppler frequency) at the mixter output is likely to be very low-frequency, i.e. in the range of <1–25 Hz for the case of a person breaking into a car, a high-value coupling capacitor 44 is used to prevent signal loss due to the finite input impedance of the signal processing stage.

Two separate stabilisation techniques are employed in the mixer arrangement. The first is the use of a resonating device in the branch connecting the collector to ground. The resonating device used is a ceramic resonator 43, and this is placed in series with the capacitance 39.

The second stabilising technique is the use of diode compensation in the bias network of the transistor 32 to cancel out temperature-induced variations in the base-emitter voltage of the transistor. This is achieved by including a diode 49 in the biasing branch 41, 42, as shown in FIG. 3.

The signal at the output of the mixer arrangement 20 consists of three components: the sum frequency $f_{LO}+(f_C+f_D)$, the difference frequency $f_{LO}-(f_C+f_D)$ and the carrier $f_c$, $f_{LO}$ being the local oscillator frequency, $f_c$ the carrier frequency and $f_D$ the Doppler frequency. Since the local oscillator and carrier frequencies are the same, the difference frequency consists of the Doppler frequency $f_D$ alone, and it is this frequency which is required to be isolated in the subsequent signal processing stage.

FIG. 4 shows the signal processing stage 60. The signal processing stage 60 consists of an amplifier 62, an active low-pass filter 63, an active rectifier 64 and a comparator section 65. The amplifier 62 amplifies the signal appearing on the emitter of transistor 32 in the mixer arrangement 20. Since it is only the low-frequency IF signal that is of interest, i.e. the Doppler frequency $f_D$, a non-critical low-bandwidth component may be used for this part of the signal processing stage. Indeed, it is desirable to employ a low-frequency component here, since then the unwanted high-frequency components of the input signal on line 50 will be automatically partly filtered out. The gain of the amplifier 62 is made variable so that various sizes of vehicle, within which the Doppler microwave sensor 50 is to be used, can be accommodated, bearing in mind that in a large vehicle movement far away from the sensor will give rise to Doppler return signals of low amplitude, and, further, that if the moving target is of small size, the amplitude of the return signal will be even lower.

The largely filtered-out HF signals at the output of the amplifier 62 are further filtered out by filter 63, which is realised as an active low-pass filter of, for example, the Sallen and Key type. The LF signal at the output of the filter 63 is taken then to a rectifier 64, which is an active precision rectifier so as to be able to accommodate low-level signals at its input, and the output of the rectifier is subsequently compared in the comparator 68 with a reference value $V_{ref}$. $V_{ref}$, along with the gain of amplifier 62, determines the sensitivity of the sensor. When the input of the comparator exceeds the threshold $V_{ref}$, a second comparator 69 is triggered, ultimately producing an open-collector output signal on a line 67 via a transistor 70. The comparator 69 operates as a diode pump, such that several triggering pulses are required on the input of this comparator before the collector of the output transistor 70 goes low. Where an indication of just a single alarm event is required, this can be taken from the output 66 of the first comparator 68.

Since the microwave sensor is to be battery powered, the sensor employs micropower amplifiers, etc, to minimise current consumption. These micropower components normally require a split positive and negative power supply, and to enable them to be used with a single supply a pseudo-earth is used. This is achieved by configuring an operational amplifier (not shown) as a voltage follower with its non-inverting input set to half-rail via a resistor network; the low output impedance of the voltage follower forms the pseudo-earth.

Figure 5:
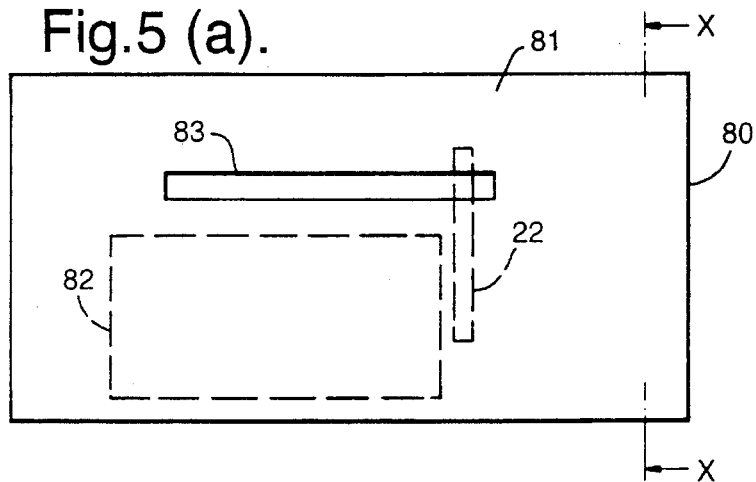
FIGS. 5a and 5b show the plan view and side view of a Doppler microwave sensor according to the further aspect of the invention.
Figure 5:
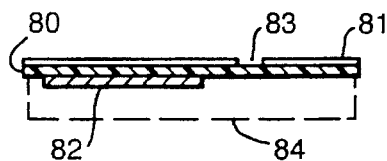

FIG. 5(a) shows a plan view of the Doppler microwave sensor according to a further aspect of the invention. In this aspect, the sensor is constructed on a printed circuit board (PCB) 80. The PCB 80 has a ground plane 81 on its upperside and on its underside are mounted the electronics 82 (i.e. both the mixer and the processing stage) of the sensor. A slot antenna 83 is introduced into the ground plane by the removal of a section of the plane itself and this slot antenna 83 is coupled to the mixer in the electronics 82 via the antenna 22 of the mixer.

FIG. 5(b) gives an end view of the PCB arrangement along the line X—X in FIG. 5(a). FIG. 5(b) shows the electronics 82 and the ground plane 81 with the etched-out section 83 forming the slot antenna. Also shown is a metal can 84. Metal can 84 is electrically connected to the ground plane 81 and acts as a Faraday cage around the electronics, preventing electro-magnetic interference from entering the alarm.

Figure 6:
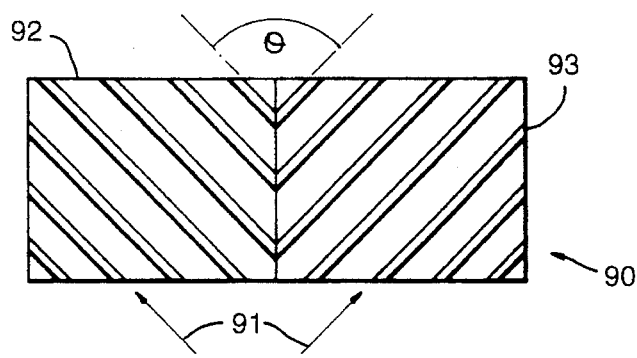
FIGS. 6a and 6b show plan and side views of a dielectric lens used in a Doppler microwave sensor according to the further aspect of the invention.
Figure 6:
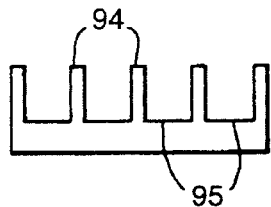

In order to make the beam pattern of the slot antenna conform more to the shape of the vehicle interior, a dielectric lens is placed over the slot antenna 83. This lens is shown in FIG. 6(a) in plan view and in FIG. 6(b) in side elevation looking along the arrows 91. The lens 90 is made of perspex or other dielectric material and consists of two half-chevrons 92, 93 set at an angle θ to each other. The half-chevrons 92, 93 comprise raised portions 94 and troughs 95 made in the dielectric material.

Figure 7:
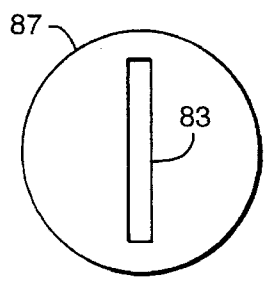
FIGS. 7a and 7b show the beam pattern of a slot antenna used in a Doppler microwave sensor according to the further aspect of the invention, with and without the dielectric lens of FIG. 6.
Figure 7:
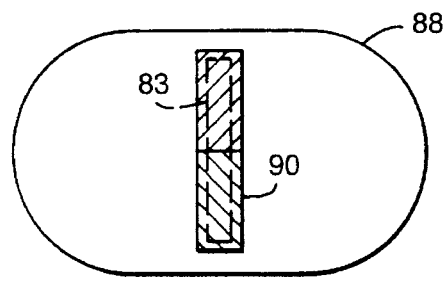

The effect of such a lens is illustrated in FIG. 7. In FIG. 7 the beam pattern for a slot antenna 83 without the lens is shown as the contour 87, while that for the antenna plus lens 90 is shown as the contour 88. (Contour 88 is shown somewhat exaggerated). The degree of eccentricity of the contour 88 is determined by the angle θ, and this can be adjusted to suit the length/width ratio of different vehicles.

FIG. 8 shows a preferred way of mounting the Doppler microwave sensor in a vehicle. The sensor 100 is mounted in a car 110 to be protected in such a way that the metal floor 105 of the car is used as a reflector, the longitudinal axis of the slot antenna lying perpendicular to the plane of the paper. The unit 100 is mounted centrally in the vehicle, for example behind the handbrake, approximately 20 mm above the floor pan. The distance of the sensor 100 above the floor pan determines the efficiency of the sensor, and if this distance is significantly reduced, the detection range of the sensor will be reduced. The sensitivity of the sensor is adjusted so that a coverage range of at least 2 metres is achieved, as shown in FIG. 8.

We claim:

1. A Doppler microwave sensor, comprising: a mixer stage having an output; a signal processing stage following the mixer stage, the signal processing stage including a signal amplifying means for amplifying a signal from the output of the mixer stage, a filtering means for filtering out signals other than a wanted low-frequency Doppler signal at an output of the signal amplifying means, a rectifying means fed from the filtering means, and a comparator means fed from the rectifying means, the comparator means being arranged to provide a sensor output signal when the signal at its input exceeds a given threshold; the mixer stage and the signal processing stage being mounted on a printed circuit board having first and second faces, the first face having disposed thereon conductive tracks for the mounting of component parts of the mixer stage and the signal processing stage on the board, and the second face having disposed thereon a ground plane having defined therein a slot antenna which is coupled to the mixer stage; and an electrically conductive enclosure which is electrically connected to the ground plane, the enclosure being disposed behind the slot antenna and enclosing the component parts of the mixer stage and the signal processing stage.

2. A Doppler microwave sensor, as claimed in claim 1, in which a microwave lens comprising an area of dielectric material is disposed over the slot antenna to modify the beam pattern of the slot antenna.

3. A Doppler microwave sensor, as claimed in claim 2, in which the dielectric lens comprises a series of chevrons situated one behind the other along an axis substantially perpendicular to a longitudinal axis of the slot antenna and substantially bisecting that longitudinal axis, those chevrons being incomplete which come to a virtual point outside the area occupied by the lens, the chevrons being formed by raised portions of the material composing the lens.

4. A Doppler microwave sensor, comprising: a mixer stage and a signal processing stage following the mixer stage, the mixer stage and the signal processing stage being mounted on a printed circuit board, the printed circuit board having a ground plane, in which is defined a slot antenna coupled to the mixer stage and to which an electrically conductive enclosure is electrically connected, the enclosure being disposed behind the slot antenna and enclosing the component parts of the mixer stage and signal processing stage, a microwave lens comprising an area of dielectric material being disposed over the slot antenna to modify the beam pattern of the slot antenna, the dielectric lens comprising a series of chevrons situated one behind the other along an axis substantially perpendicular to a longitudinal axis of the slot antenna and substantially bisecting the longitudinal axis, those chevrons being incomplete which come to a virtual point outside the area occupied by the lens, the chevrons being formed by raised portions of the material composing the lens, the signal processing stage comprising a signal-amplifying means for amplifying the signal from the output of the mixer stage, a filtering means for filtering out signals other than a wanted low-frequency Doppler signal at an output of the amplifying means, a rectifying means fed from the filtering means and comparator means fed from the rectifying means, the comparator means being arranged to provide a sensor output signal when the signal at its input exceeds a given threshold.

5. A Doppler microwave sensor, as claimed in claim 1, in which the comparator means comprises a diode pump for providing a weighted sensor output signal.

6. A Doppler microwave sensor, as claimed in claim 1 or claim 4, in which the mixer stage is a mixer arrangement comprising a self-oscillating mixer stage and an antenna connected to the self-oscillating mixer stage, the antenna serving both as a transmit antenna and as a receive antenna, the self-oscillating mixer stage comprising a bipolar transistor roving a base, a collector and an emitter, and comprising first and second potential levels and a reference potential level, the collector of the transistor being coupled to the first potential level by means of a first inductance and to the reference potential level by means of a first capacitance and at ceramic resonator in series, the base of the transistor being coupled by means of a second inductance to the mid-point of a bias potential divider connected between the first and second potential levels, and the emitter of the transistor being coupled to the second potential level by means of a resistance and a second capacitance in parallel, the antenna being coupled to the emitter, and the output of the mixer arrangement being taken from the emitter or collector of the transistor.

7. A vehicle comprising a Doppler microwave sensor as claimed in claim 1 or claim 4.

8. A mixer arrangement, comprising: a self-oscillating mixer stage and an antenna connected to the self-oscillating mixer stage, the antenna serving both as a transmit antenna and as a receive antenna, the self-oscillating mixer stage comprising a bipolar transistor having a base, a collector and an emitter, and comprising first and second potential levels and a reference potential level, the collector of the transistor being coupled to the first potential level by means of a first inductance and to the reference potential level by means of a first capacitance and a ceramic resonator in series, the base of the transistor being coupled by means of a second inductance to the mid-point of a bias potential divider connected between the first and second potential levels, a lower half of the potential divider comprising a series-connected diode for the compensation of variations in the base-emitter voltage of the transistor with temperature, and the emitter of the transistor being coupled to the second potential level by means of a resistance and a second capacitance in parallel, the antenna being coupled to the emitter, and the output of the mixer arrangement being taken from the emitter or collector of the transistor.

9. A mixer arrangement, comprising: a self-oscillating mixer stage and an antenna connected to the self-oscillating mixer stage, the antenna sewing both as a transmit antenna and as a receive antenna, the self-oscillating mixer stage comprising a bipolar transistor having a base, a collector and an emitter, and comprising first and second potential levels and a reference potential level, the collector of the transistor being coupled to the first potential level by means of a first inductance and to the reference potential level by means of a first capacitance and a ceramic resonator in series, the base of the transistor being coupled by means of a second inductance to the mid-point of a bias potential divider connected between the first and second potential levels, and the emitter of the transistor being coupled to the second potential level by means of a resistance and a second capacitance in parallel, the antenna being coupled to the emitter, and the output of the mixer arrangement being taken from the emitter or collector of the transistor.

10. A mixer arrangement as claimed in claim 9, in which the self-oscillating mixer stage comprises a diode means for compensating for variations in the base-emitter voltage of the transistor with temperature, the diode means being connected in series with a lower half of the bias potential divider.

11. A mixer arrangement, as claimed in claim 8 or claim 10, in which the reference potential level and the first or second potential level are substantially the same.

* * * * *